US006806144B2

(12) United States Patent  (10) Patent No.: US 6,806,144 B2
Chen et al. (45) Date of Patent: Oct. 19, 2004

(54) METHOD AND APPARATUS FOR IMPROVED GATE OXIDE UNIFORMITY WITH REDUCING SYSTEM CONTAMINANTS

(75) Inventors: Pu-Fan Chen, Taipei (TW); Chao-Po Lu, Hsinchu (TW); Hsi-Shen Chuang, Hsinchu (TW); Yi-Jen Chen, Tainan (TW); Chin-Tsai Chen, Kaohsiung (TW); Tsukada Kazunori, Hsin Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 170 days.

(21) Appl. No.: 10/217,860

(22) Filed: Aug. 13, 2002

(65) Prior Publication Data
US 2004/0031440 A1 Feb. 19, 2004

(51) Int. Cl.[7] .......................... H01L 21/336; B05D 3/06
(52) U.S. Cl. ..................... 438/287; 438/773; 427/579
(58) Field of Search ................. 116/715, 726; 427/575–579; 438/287, 765–773, 790

(56) References Cited

U.S. PATENT DOCUMENTS

| 5,190,913 A | * | 3/1993 | Higashiyama et al. ...... 118/690 |
| 5,240,403 A | * | 8/1993 | McAnespie .................... 431/5 |
| 5,593,741 A | * | 1/1997 | Ikeda ......................... 427/579 |
| 5,837,205 A | * | 11/1998 | Bayer et al. ................ 422/109 |

* cited by examiner

Primary Examiner—Matthew Smith
Assistant Examiner—Calvin Lee
(74) Attorney, Agent, or Firm—Tung & Associates

(57) ABSTRACT

A method and apparatus for improving a uniformity of a thermally grown silicon dioxide layer including thermally growing a layer over the exposed silicon portions including silicon dioxide according to a thermal oxide growing process; exposing the gas reactant feed lines to reactant gases during at least one of the step of thermally growing a layer and a cleaning process following the step of thermally growing a layer; and, purging the gas flow pathways to bypass the reactor chamber with at least one purge gas source including an inert gas to remove residual reactant gas contaminants to improve a subsequently thermally grown silicon dioxide layer.

11 Claims, 2 Drawing Sheets

METHOD AND APPARATUS FOR IMPROVED GATE OXIDE UNIFORMITY WITH REDUCING SYSTEM CONTAMINANTS

FIELD OF THE INVENTION

This invention generally relates to ultra thin gate oxide manufacture and more particularly to an improved method and apparatus for reducing oxidation furnace system contaminants to improve gate oxide uniformity.

BACKGROUND OF THE INVENTION

In the semiconductor fabrication process, one of the more important processing steps is the formation of a high quality insulating gate oxide layer in the field of semiconductor devices fabrication. Many broad categories of commercial devices, such as electrically erasable programmable read only memories (EEPROMs), dynamic random access memories (DRAMs), and more recently, even high-speed basic logic functions, owe their commercialization to the reproducibility of high quality, very thin oxide layers. High quality dielectrics are needed in such devices to achieve satisfactory device performance both in terms of speed and longevity.

Hot carrier effects and sub-threshold leakage currents are problematic in short channel devices. One technique to combat short channel effects has involved the scaling of gate dielectrics. To compensate for the potentially lower drive currents for a given short channel device, conventional silicon dioxide gate oxide layers are made as thin as possible to maximize drive current. However, the scaling of silicon dioxide gate dielectric layers has introduced another set of problems. For example, thin silicon dioxide layers have been historically difficult to fabricate with a uniform thickness across a given wafer area, from wafer to wafer and from lot to lot. In addition, as the thickness of silicon dioxide is scaled downward, the potential for reliability problems associated with dielectric breakdown and hot and cold carrier injection degradation increases. Hot and cold carrier degradation can significantly reduce device performance, while dielectric breakdown can lead to complete device failure.

Ultra-thin gate oxides (less than about 30 Angstroms) are required for achieving small and fast device technology, for example, at device dimensions below about 0.13 microns. Uniformity is one of the major challenges in ultra-thin gate oxide fabrication since such uniformity is strongly correlated with gate oxide integrity. Most conventional gate insulating layers are pure $SiO_2$ (silicon dioxide) films formed by thermal oxidation. Others employ a combination of a high temperature deposited $SiO_2$ layer on a thermally grown layer.

Generally, silicon dioxide layers can be grown within a temperature range from about 400° C. to about 1150° C. The growth process may be carried out in resistance-heated furnaces or in rapid thermal process chambers heated by, for example, tungsten-halogen lamps. Typically, either a horizontal or a vertical furnace tube is used for resistance heated furnaces where after loading a batch of process wafers into a furnace, the furnace is heated to (ramped-up) a temperature suitable for oxidation of silicon. The process wafers are then held at the elevated temperature (annealed) for a period of time to grow an oxide layer and then cooled (ramped-down) to a lower temperature.

Silicon dioxide ($SiO_2$) can be grown by either a dry oxidation process or a wet oxidation process. In a dry oxidation process, oxygen is mixed with an inert carrier gas such as nitrogen, and is passed over a batch of process wafers at an elevated temperature. In a wet oxidation process, the process can be carried out by catalytically combusting hydrogen and oxygen in a pyrogenic steam oxidation process to form a water vapor/oxygen mixture which is then supplied to the furnace reactor tube at a predetermined elevated temperature.

FIG. 1 shows a typical pyrogenic steam oxidation system 10 including a gas feed line system according to the prior art. As shown in FIG. 1, a pyrogenic steam oxidation process may be carried out in vertical furnace tube, for example, a quartz boat 12 for holding several process wafers e.g., 14, surrounded by a tubular quartz process chamber 16, being externally surrounded by typically about 3 or more resistance heaters (not shown). Inside the quartz process chamber 16 wafer boat 12 holds a batch of silicon wafers e.g., 14 with the major surface areas arranged horizontally and stacked vertically to minimized thermal gradients. Source gases, including for example, individually fed and mixed, or premixed mixtures of, for example, $N_2$ and $O_2$ 18A, and $N_2$, $O_2$, and $H_2$, 18B, are fed through a burner heated area 28A including a catalyst core for combusting $H_2$ and $O_2$ to produce water which is carried with other source gases, e.g., $N_2$, by gas source feed line 20A to an entry point, e.g., valve 19A adjacent the top of the quartz reactor chamber 16 at inlet 20B to pass over the process wafers e.g., 14. Water vapor is thus formed by reaction between hydrogen and oxygen, acting as an oxidizing medium to produce $SiO_2$ on the silicon wafers e.g., 14. Unused reactants and reaction by-products are passed out through exhaust vacuum line 22A.

Another reactant including chlorine source gas dichloroethylene (DCE) gas source 24A is frequently fed through a separate gas feed line 26A including passing through a second burner heated area 28B to combust the chlorine source gas to form gaseous chlorine species. Source gases, including for example, individually fed and mixed, or premixed mixtures of, for example, $N_2$, $O_2$, and NO, 21A, and N2 and $H_2$, 21B, are fed through an burner heated area 28B area to provide combustion and carrier gases for the chlorine gas source 24A. For example, chlorine is frequently used as an additive in forming thin oxide layers as it has been found to neutralize charge accumulation at the Si/SiO2 interface and additionally has the beneficial property of immobilizing or gettering mobile ionic contaminants, for example, metal ions present in the reactor chamber. In addition, chlorine containing gas, for example, DCE, is also used as a step in a periodic cleaning process where the quartz boat, chamber and other components are exposed to DCE and chlorine as part of the periodic cleaning process.

According to the prior art an inert gas source 21C, for example nitrogen, in gaseous communication with gas feed line, e.g., 26B typically disposed between the heated burner area 28B and the reactor chamber 16 through a gas valve 19B to allow purging of the chlorine containing gas residue remaining in the gas feed line 26A through the reactor chamber 16 and out exhaust vacuum line 22A. A problem with this arrangement is that the reactor chamber may become further contaminated by re-deposition with chlorine containing residues and/or water vapor leading to non-uniform oxide film growth.

Controlling the growth of an ultra-thin oxide layer of less than about 30 Angstroms is difficult to control. One reason for such difficulty is simply the short pyro-time required for depositing such ultra-thin oxide layers. Another reason is the high annealing temperatures required to treat such ultra-thin oxide layers to obtain a high quality oxide. The annealing process for the ultra-thin oxide layers typically requires temperatures of about 1000° C. At this temperature, any residual contaminants including chlorine or water containing residues present in the reaction chamber or gas feed conduits leading to the reaction chamber may be a source of contamination and cause unexpected non-uniform oxide growth on the wafers thereby leading to both within wafer, wafer to wafer, and successive oxidation run non-uniformity of the oxide layer.

It would therefore be advantageous to develop a furnace system for growing silicon dioxide layers including gate oxides whereby moisture or other contaminants including chlorine containing residues present within the furnace system are reduced to allow for more uniform oxide growth leading to more reliable electrical performance and successful scale-down of semiconductor structures.

It is therefore an object of the invention to provide a furnace system for growing silicon dioxide layers including gate oxides whereby moisture or other contaminants including chlorine containing residues present within the furnace system are reduced to allow for more uniform oxide growth leading to more reliable electrical performance and successful scale-down of semiconductor structures while overcoming other shortcomings in the prior art.

SUMMARY OF THE INVENTION

To achieve the foregoing and other objects, and in accordance with the purposes of the present invention, as embodied and broadly described herein, the present invention provides a method for a method and apparatus for improving a uniformity of a thermally grown silicon dioxide layer.

In a first embodiment, the method includes thermally growing a layer over the exposed silicon portions including silicon dioxide according to a thermal oxide growing process; exposing the gas reactant feed lines to reactant gases during at least one of the step of thermally growing a layer and a cleaning process following the step of thermally growing a layer; and, purging the gas flow pathways to bypass the reactor chamber with at least one purge gas source including an inert gas to remove residual reactant gas contaminants to improve a subsequently thermally grown silicon dioxide layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained with respect to exemplary embodiments of a furnace system for forming thin silicon dioxide layers, it will be appreciated that the added exhaust line including one or more purge gas sources and associated purge lines may be advantageously adapted to other surface configurations where it would be advantageous to provide a high purity system including cleaning and purging gas feed lines without exposing the reactor chamber for improving a within wafer uniformity of thin oxide layer thicknesses, for example, less than about 30 Angstroms, and for improving an oxide layer thickness uniformity including within wafer, wafer to wafer and between successive lots of wafers in different oxide layer forming processes.

It has been found in forming ultra thin gate oxides, for example, less than about 30 Angstroms, for example including about 10 to about 20 Angstroms, that contaminants including water and/or residual chlorine source gases, for example, 1,1 dichloroethylene (DCE) resulted in unacceptable gate oxide uniformity including within wafer uniformity of silicon dioxide layer thicknesses using a silicon oxide growth furnace system according to the prior art.

The present invention addresses improvements to silicon oxide growth furnace system to improve ultra thin oxide uniformity by providing a method and gas purging system for reducing impurities, including water and chlorine present in gas reactant feed lines including in-line components such as combustion sources while avoiding exposure of the reactor chamber to such impurities.

Figure 1:
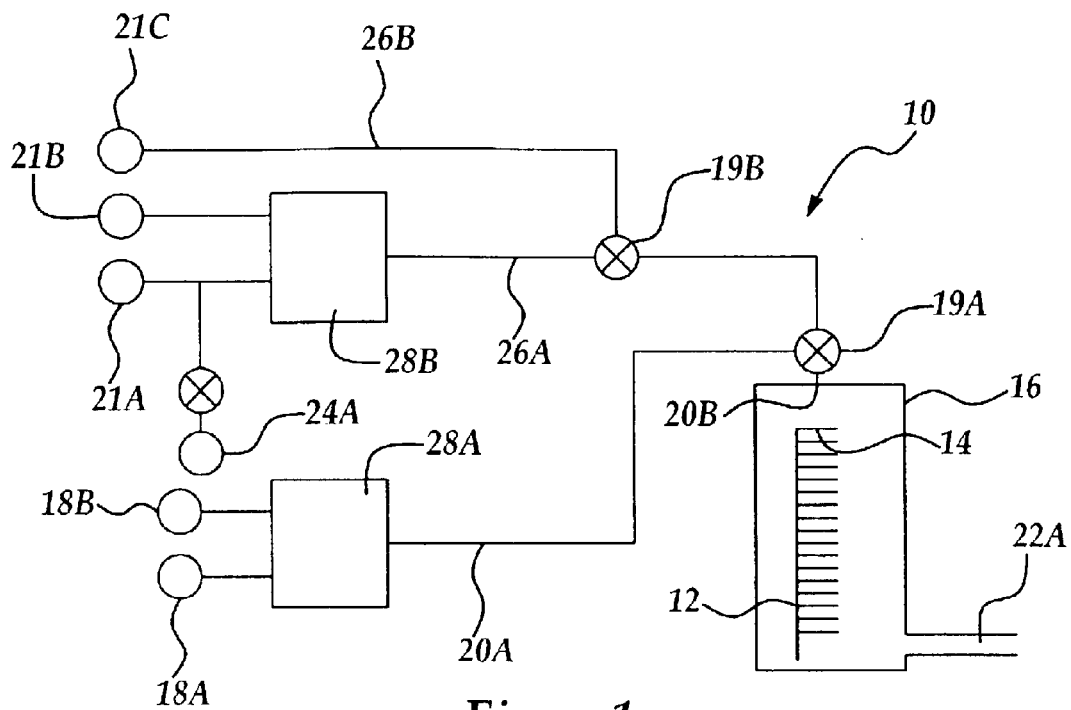
FIG. 1 is an exemplary representational schematic of a furnace system for thermally growing silicon dioxide layers according to the prior art.
Figure 2:
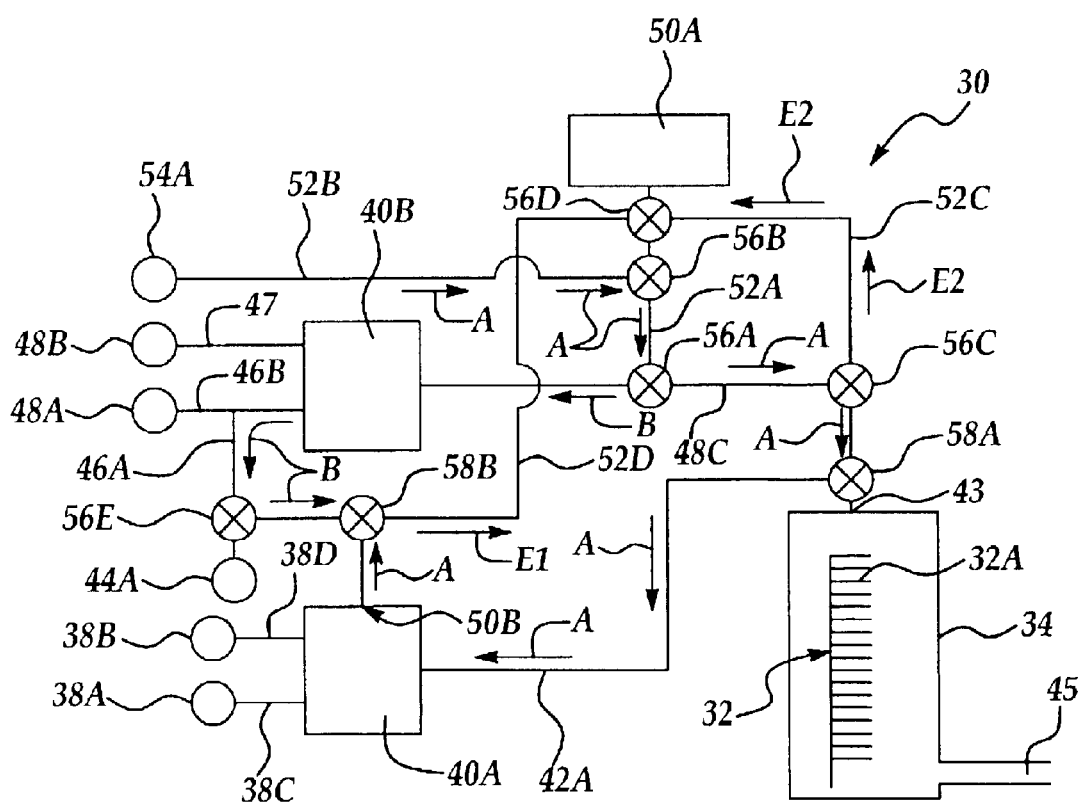
FIG. 2 is an exemplary representational schematic of one embodiment of a furnace system according to the present invention for thermally growing silicon dioxide layers.

In an exemplary embodiment, referring to FIG. 2, an exemplary pyrogenic steam oxidation furnace 30 including a gas feed line system allowing a purging operation of the gas feed line system while avoiding a purging gas flow pathway through the reactor chamber according to the present invention is shown. The pyrogenic steam oxidation furnace 30 includes a quartz wafer boat 32 for holding several process wafers e.g., 32A, surrounded by a quartz reactor chamber 34, being surrounded by typically about 3 or more resistance heaters (not shown) controlled by a temperature controller which is in turn controlled by a system controller, for example a computer processing system (not shown). Inside the quartz reactor chamber 34 wafer boat 32 holds a batch of silicon wafers e.g., 32A with the major surface areas arranged parallel to horizontal and stacked vertically to minimized thermal gradients. Source gases, including for example, individually fed and mixed, or pre-mixed mixtures of, for example, $N_2$ and $O_2$ 38A, and $N_2$, $O_2$, and $H_2$, 38B, are fed by gas feed lines 38C and 38D, respectively, through a first combustion means 40A, for example a burner heated area, preferably including a catalyst core (not shown) for combusting $H_2$ and $O_2$ to produce water which is carried with other source gases, e.g., $N_2$, by gas feed line 42A to an upper portion of the quartz reactor chamber 34 at inlet 43 to pass over the process wafers e.g., 32A. Unused reactants and reaction by-products are passed out through exhaust vacuum line 45.

Preferably, pyrogenic reactant gases including a chlorine containing gas, preferably formed from dichloroethylene (DCE), is provided through a separate gas feed line, e.g., 48C to avoid contamination of gas feed line 42A and to avoid contaminating the catalyst core included in first combustion means 40A. For example DCE gas source 44A provides DCE via gas feed line 46A to mix with gas source 48A, e.g., $N_2$, $O_2$, and NO supplied by gas feed line 46B to pass through second combustion means 40B, including, for example, a burner heated area with a quartz nozzle output (not shown) also supplied by gas source 48B, e.g., $N_2$ and $H_2$ through gas feed line 47 to form pyrogenic reactant gases including water, chlorine containing gases and nitrogen. After passing through second combustion means 40B, reactants are supplied to the reactor chamber via gas feed line 48C. It will appreciated that the DCE may optionally be pre-mixed or mixed in a gas mixing means prior to supply to the second combustion means 40B. It will also be appreciated that gas sources 48A and 48B may be individually fed and mixed in a gas mixing means or pre-mixed prior to supply to the second combustion means 40B.

Still referring to FIG. 2, in a first embodiment of the present invention, a separate process exhaust port 50A, for example including a vacuum pumping means (not shown) and an exhaust gas purifying means (not shown), for example a bubbler, is disposed to communicate with gas feed line 48C between the reactor chamber 34 and the second combustion means 40B. For example, exhaust port 50A is in gaseous communication with gas feed line 52A which communicates with gas feed line 48C between the second combustion means 40B and the reactor chamber 34 through a gas valve 56A, for example, a 3-way automated valve disposed at an intersecting portion of gas feed lines 48C and 52A. By '3-way automated valve' is meant a gas flow communication valve capable of automated control, for example by communication with a system controller, to establish flowable gaseous communication with any two of three intersecting gas feed portions including shutting off gas flow communication. Preferably, a purge gas source 54A, e.g., $N_2$, is supplied to line 52A, for example by gas feed line 52B flowably communicating with gas feed line 52A by way of 3-way automated valve 56B. It will be appreciated that other types of gas flow control valves may be used as long as control of a purge gas flow pathway to purge the gas feed lines including the first combustion means and second combustion means can be accomplished as explained further below.

In exemplary operation, following a process including the supply of at least one of DCE source gas 44A through second combustion means 40B and gas feed line 48C to supply reactants provided by first combustion means 40A including supplying water vapor through gas feed line 42A to reactor chamber 34, a purging process using inert gas, for example nitrogen, is carried out to purge (clean) at least a portion of the gas feed lines of pyrogenic oxidation furnace system 30 while avoiding exposing the reactor chamber 34 to the purged gas flow pathway. In exemplary operation, inert gas source 54A, preferably nitrogen, is controllably supplied, preferably including automated gas flow control means, for example an automated mass flow controller(not shown) to gas valve 56B along gas feed line 52B as shown by gas flow directional arrow gas flow pathway A, then along gas line 52A to gas valve 56A. The purge gas flow pathway A proceeds along gas feed line 48C to valve 56C, for example a 3-way automated valve including optional flowable communication with gas line 52C for carrying purged gases along purge gas flow pathway E2 to gas valve 56D, for example a 4-way automated valve to exit through exhaust port 50A. By '4way automated valve' is meant a gas flow communication valve capable of automated control, for example by communication with a system controller, to establish flowable gaseous communication with any two of four intersecting gas feed portions including shutting off gas flow communication.

Alternatively, the purge gas flow pathway follows purge gas flow pathway A to gas valve 58A, for example a 3-way automated valve, along gas feed line 42A through first combustion means 40A and out exhaust port 50B. Preferably, exhaust port 50B is in communication with gas valve 58B, for example, a 4-way automated valve in gaseous communication with gas feed line 52D to follow gas flow pathway E1 to gas valve 56D and out exhaust port 50A. By providing alternative gas flow purge gas pathways, for example E2 and E1, the gas feed lines including residual DCE may subjected to separate first purge process without contaminating catalyst core included in the first combustion means 40A. For example, after first purging the gas feed lines, e.g., 48C through exhaust flow pathway E2, the purge gas flow pathway can be diverted to gas flow pathway A through gas feed line 42A; through first combustion means 40A; and through exhaust flow pathway E1 without contaminating line 42A or catalyst core in first combustion means 40A with residual DCE.

In alternative operation gas valve 56A diverts the purge gas along purge gas flow pathway B through second combustion means 40B along gas feed line 46B; then along gas feed line 46A to gas valve 56E, for example a 3-way automated valve and subsequently to gas valve 58B to be directed out purge gas flow exhaust pathway E1 to exhaust port 50A. Preferably gas valve 56E is disposed a near as possible to DCE source 44A to ensure purging of as much of the DCE gas flow pathway as possible. It will be appreciated that other gas flow pathways are possible with the exemplary gas line feed system including the selectively controllable gas valves. In addition, it will be appreciated that the order of altering the gas flow pathways may be changed, however, preferably, chlorine containing residuals are first purged followed by purging gas flow pathways including residual water to avoid contaminating gas feed lines not previously contaminated with chlorine and avoid contaminating the catalyst core in the first combustion means with chlorine.

Figure 3:
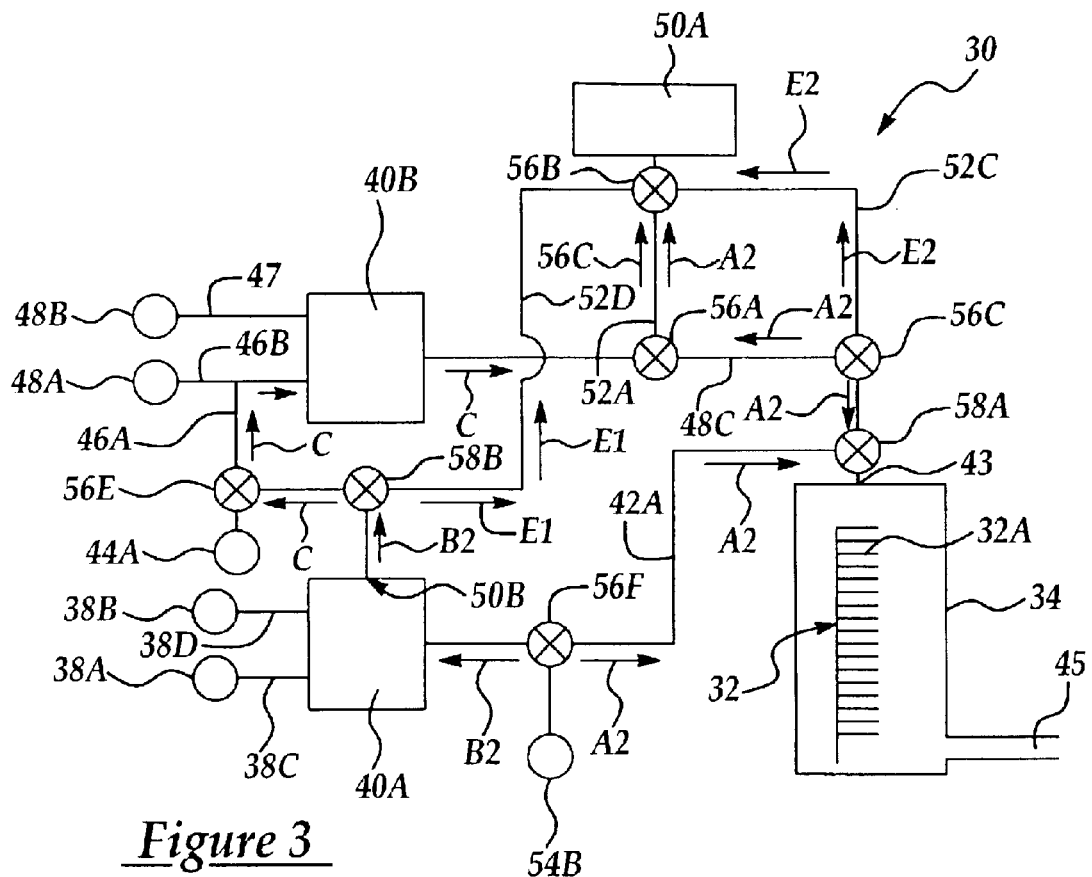
FIG. 3 is an exemplary representational schematic of one embodiment of a furnace system according to the present invention for thermally growing silicon dioxide layers.

Referring to FIG. 3, in another exemplary embodiment, inert purge gas source 54B is provided in communication with gas feed line 42A between gas valve 58A and first combustion means 40A through gas valve 56F, for example a 3-way automated valve. In exemplary operation, inert gas source 54B, preferably nitrogen, is controllably supplied, preferably including automated gas flow control means, for example an automated mass flow controller(not shown) to follow purge gas pathways A2 or B2. For example, following purge gas flow pathway B2 through first combustion means 40A and out exhaust port 50B; through gas valve 58B; and diverted along purge gas exhaust flow pathway E1 and out exhaust port 50A. Alternatively, the purge gas flow pathway B2 may be diverted by gas valve 58B along purge gas flow pathway C through valve 56E; along gas feed lines 46A and 46B; through second combustion means 40B; to valves 56A and 56D and out exhaust port 50A. Following another purge gas flow pathway A2 from gas valve 56F along gas feed line 42A to valve 58A and 56C; along gas feed line 48C to valve 56A and 56B and subsequently out exhaust port 50A. This embodiment including the gas purge source disposed between first combustion means 40A and reactor chamber 34 is preferable in that operation of the system is easier and the accidental spreading of chlorine contamination is minimized since the chlorine contaminated gas feed line sections are in the downstream gas flow of the purge gas flow pathways.

Figure 4:
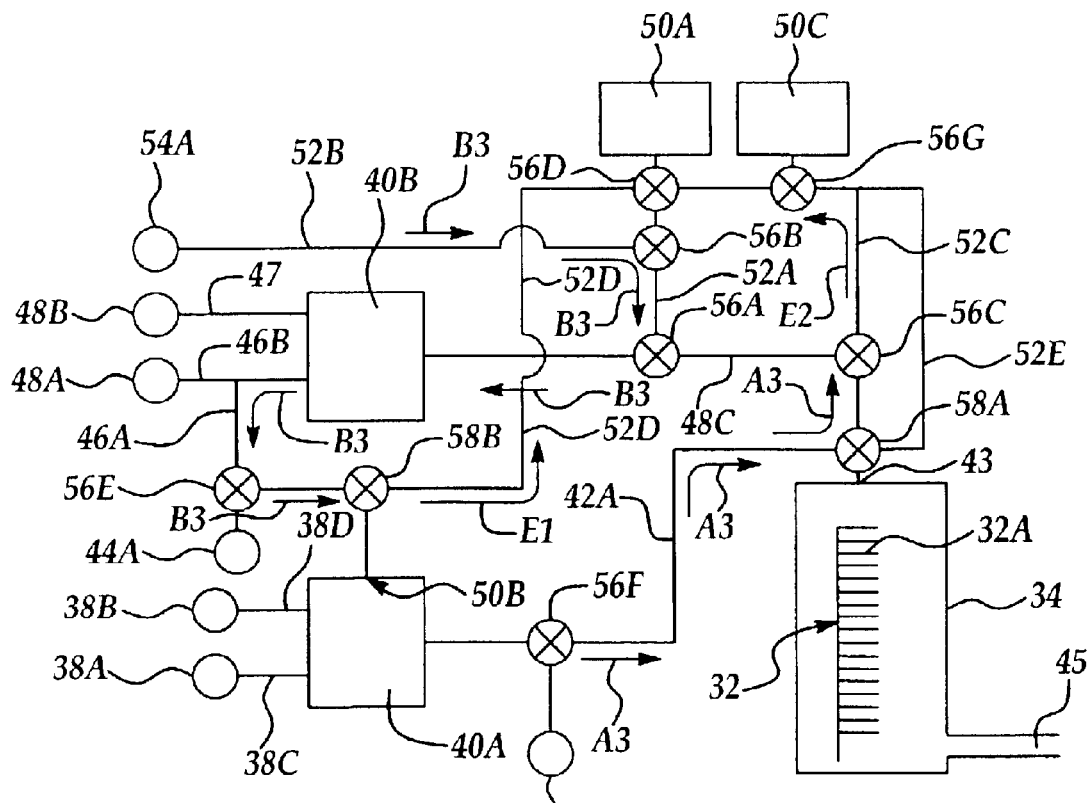
FIG. 4 is an exemplary representational schematic of one embodiment of a furnace system according to the present invention for thermally growing silicon dioxide layers.

Referring to FIG. 4, in another embodiment, both inert gas purge sources 54A and 54B are included. In this embodiment, the separate portions of the gas feed line system may be independently and simultaneously purged. For example, as shown including an optional additional exhaust port 50C, following purge gas flow pathway A3 in communication with exhaust flow pathway E2, for example exiting out exhaust port 50C and purge gas flow pathway B3 in communication exhaust gas flow pathway E1 and exciting through exhaust gas port 50A, simultaneously purge gas flows may be carried out along independent gas flow pathways, thereby reducing the overall purge time. In addition, the spreading of either chlorine or water vapor contamination from one gas flow portion pathway to the other gas flow portion pathway is more easily avoided. Optionally, gas feed line 52E may be added for further flexibility in independently purging portions of the gas feed lines.

According to embodiments of the present invention, in an exemplary implementation of the invention, carrying out purging operations on the gas feed line portions of an exemplary oxide growth furnace system using a KOKUSAI™ furnace following use of the gas feed lines including deposited residues of water and DCE, resulted in an improvement of within wafer uniformity of between about 1% to about 3:5% on gate oxide layers formed having a thickness of about 16 Angstroms.

While the embodiments illustrated in the Figures and described above are presently preferred, it should be understood that these embodiments are offered by way of example only. The invention is not limited to a particular embodiment, but extends to various modifications, combinations, and permutations that nevertheless fall within the scope of the appended claims. It will be apparent to those skilled in the art that numerous variations, modifications, and substitutions may be made without departing from the spirit of the invention as disclosed and further claimed below.

What is claimed is:

1. A method for improving a uniformity of a thermally grown silicon dioxide layer comprising the steps of:

providing a furnace system for growing oxide layers comprising gas reactant feed lines further comprising gas flow pathways for providing gas reactants to a reactor chamber said reactor chamber equipped for heating semiconductor wafers to thermally grow a silicon dioxide layer;

providing at least one silicon semiconductor wafer comprising exposed portions of silicon within the reactor chamber;

thermally growing a layer over the exposed silicon portions comprising silicon dioxide according to a thermal oxide growing process;

exposing the gas reactant feed lines to reactant gases during at least one of the step of thermally growing a layer and a cleaning process following the step of thermally growing a layer; and, purging the gas flow pathways to bypass the reactor chamber with at least one purge gas source comprising an inert gas to remove residual reactant gas contaminants to improve a subsequently thermally grown silicon dioxide layer.

2. The method of claim 1, wherein the reactant gases comprise at least one of a chlorine containing gas and a water vapor containing gas.

3. The method of claim 2 wherein the chlorine containing gas is supplied along a first gas flow pathway to the reactor chamber and the water vapor containing gas is supplied along a second gas flow pathway to the reactor chamber.

4. The method of claim 3 wherein the first and second gas flow pathways further comprise in-line burners to at least partially combust reactant gases.

5. The method of claim 4, wherein the second flow pathway comprises an in-line burner comprising a chlorine sensitive catalyst.

6. The method of claim 5, wherein the step of purging the gas flow pathways comprises selectively purging the first and second gas flow pathways to avoid chlorine contaminating the chlorine sensitive catalyst.

7. The method of claim 3 wherein the step of purging the gas flow pathways comprises sequentially selectively purging portions of the first and second gas flow pathways.

8. The method of claim 7, wherein the step of purging the gas flow pathways comprises selectively purging portions of the first gas flow pathway followed by selectively purging portions of the second gas flow pathway.

9. The method of claim 3, wherein substantial portions of the first flow pathway for passing chlorine containing gas and the second gas flow pathway for passing water vapor containing gas are purged to remove residual contamination.

10. The method of claim 1 wherein the step of purging the gas flow pathways comprises purging at least one gas flow pathway through at least one exhaust port provided in gaseous communication with the gas flow pathways.

11. The method of claim 10, wherein the step of purging the gas flow pathways comprises purging at least two flow pathways comprising portions of the first gas flow pathway and the second gas flow pathway simultaneously using at least two purge gas sources.

* * * * *